United States Patent [19]
Lardeau et al.

[11] Patent Number: 6,124,677
[45] Date of Patent: Sep. 26, 2000

[54] METHOD AND CIRCUIT FOR TESTING THE OUTPUT CONNECTIONS OF A DRIVER CIRCUIT FOR A PLASMA DISPLAY PANEL

[75] Inventors: Celine Lardeau; Gilles Troussel, both of Grenoble; Eric Benoit, Eybens, all of France

[73] Assignee: STMicroelectronics S.A., Gentilly, France

[21] Appl. No.: 09/405,974

[22] Filed: Sep. 27, 1999

[30] Foreign Application Priority Data

Sep. 28, 1998 [FR] France .................................. 98 12101

[51] Int. Cl.$^7$ ........................................................ G09G 3/10
[52] U.S. Cl. ...................................... 315/169.4; 315/169.1; 345/204; 345/214
[58] Field of Search .............................. 315/169.1–169.4; 345/98, 99, 212, 211, 214, 204

[56] References Cited

U.S. PATENT DOCUMENTS

| | | | |
|---|---|---|---|
| 4,384,287 | 5/1983 | Sakuma ............................. | 315/169.4 X |
| 4,492,957 | 1/1985 | Marentic ........................... | 315/169.4 X |
| 4,496,879 | 1/1985 | Suste .................................... | 315/169.4 |
| 4,859,870 | 8/1989 | Wong et al. ............................ | 307/263 |
| 5,428,300 | 6/1995 | Takahashi et al. ...................... | 324/770 |
| 5,656,893 | 8/1997 | Shino et al. .......................... | 315/169.4 |
| 5,870,409 | 2/1999 | Yach et al. ............................. | 371/22.1 |

FOREIGN PATENT DOCUMENTS 0 680 067 A2  11/1995  European Pat. Off. .

*Primary Examiner*—Haissa Philogene
*Attorney, Agent, or Firm*—Theodore E. Galanthay; Stephen C. Bongini; Fleit, Kain, Gibbons, Gutman & Bongini P.L.

[57] ABSTRACT

A method for testing output connections of at least one driver circuit that drives a plasma display panel. According to the method, at least one output of the driver circuit is switched to a high level for a predetermined time period. The output of the driver circuit is switched to a low level, and the time to discharge the output of the driver circuit with a constant discharge current is measured. It is determined whether a capacitive load is connected to the output of the driver circuit based on the measured time to discharge. In one preferred method, these steps are repeated for each of the outputs of the driver circuit. A driver circuit for driving a plasma display panel is also provided. The driver circuit includes driver output stages, and means for selectively sinking a constant discharge current from the output of at least one of the driver output stages to ground. Additionally, the driver circuit includes means for producing a measuring logic pulse whose duration is a function of a time required to discharge the output, and means for determining whether a capacitive load is connected to the output based on the measuring logic pulse.

23 Claims, 3 Drawing Sheets

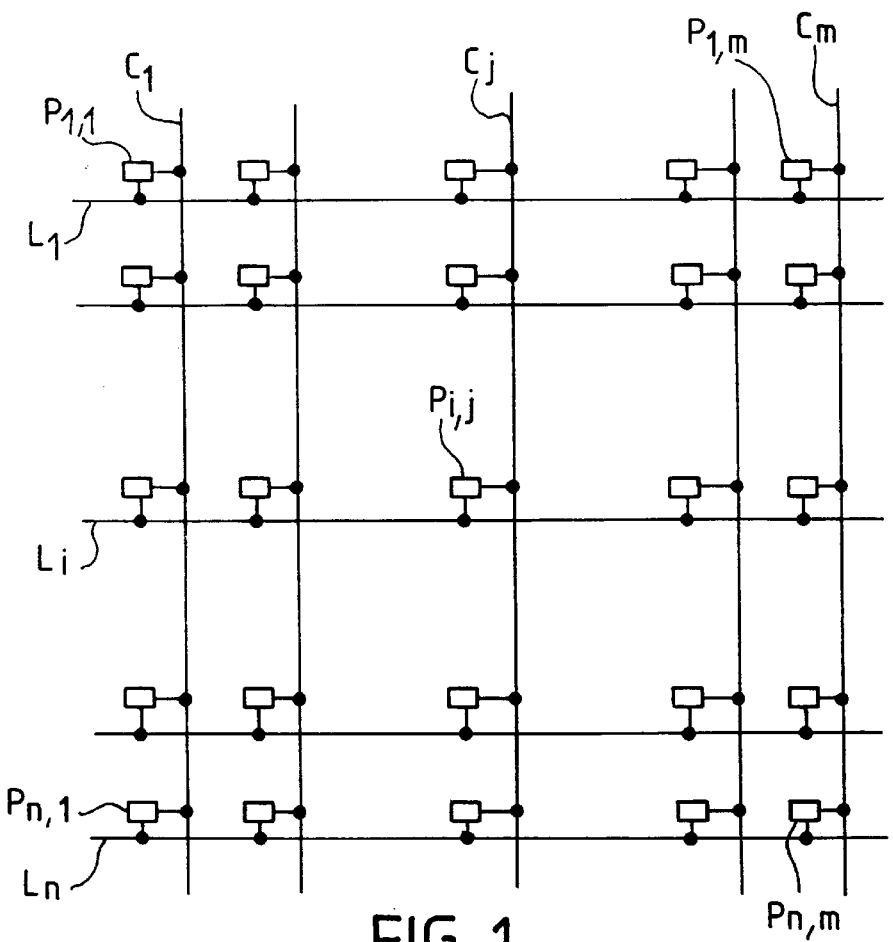
FIG_1
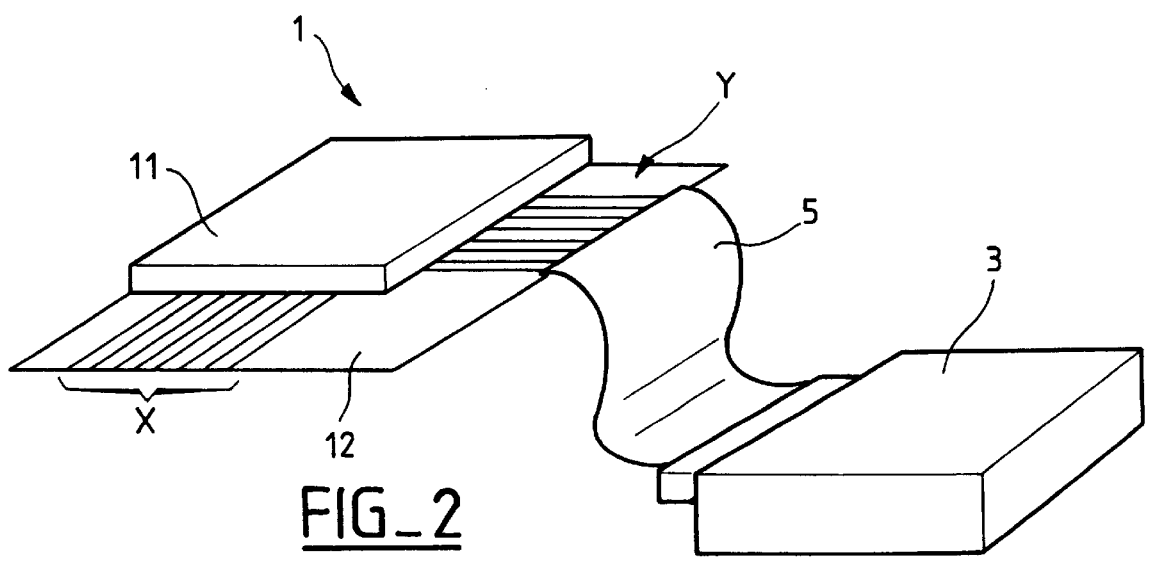
FIG_2

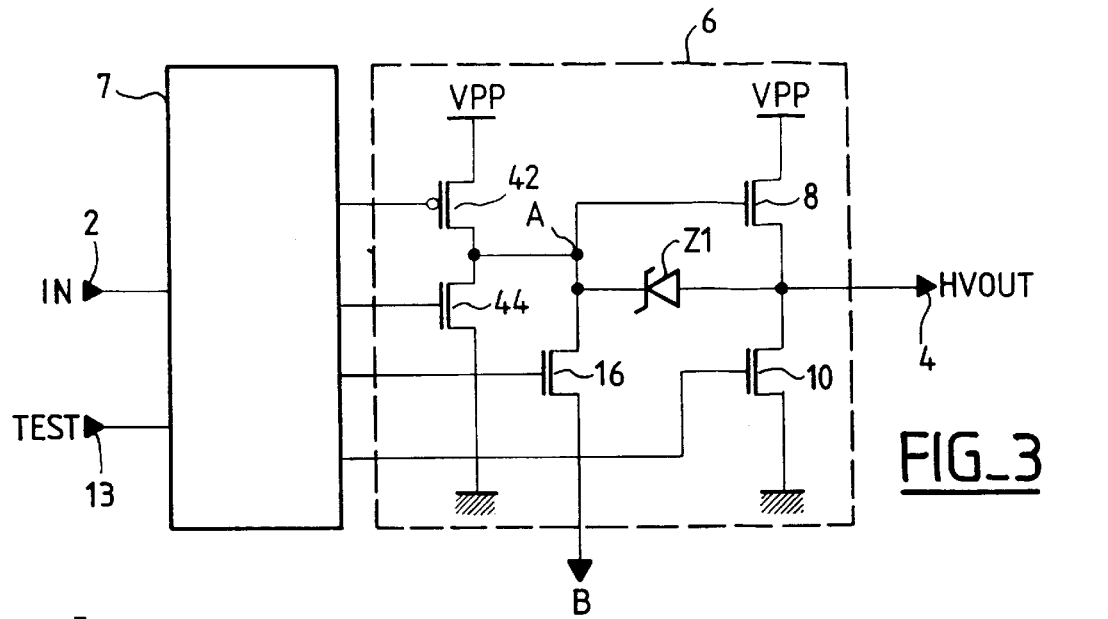
FIG_3
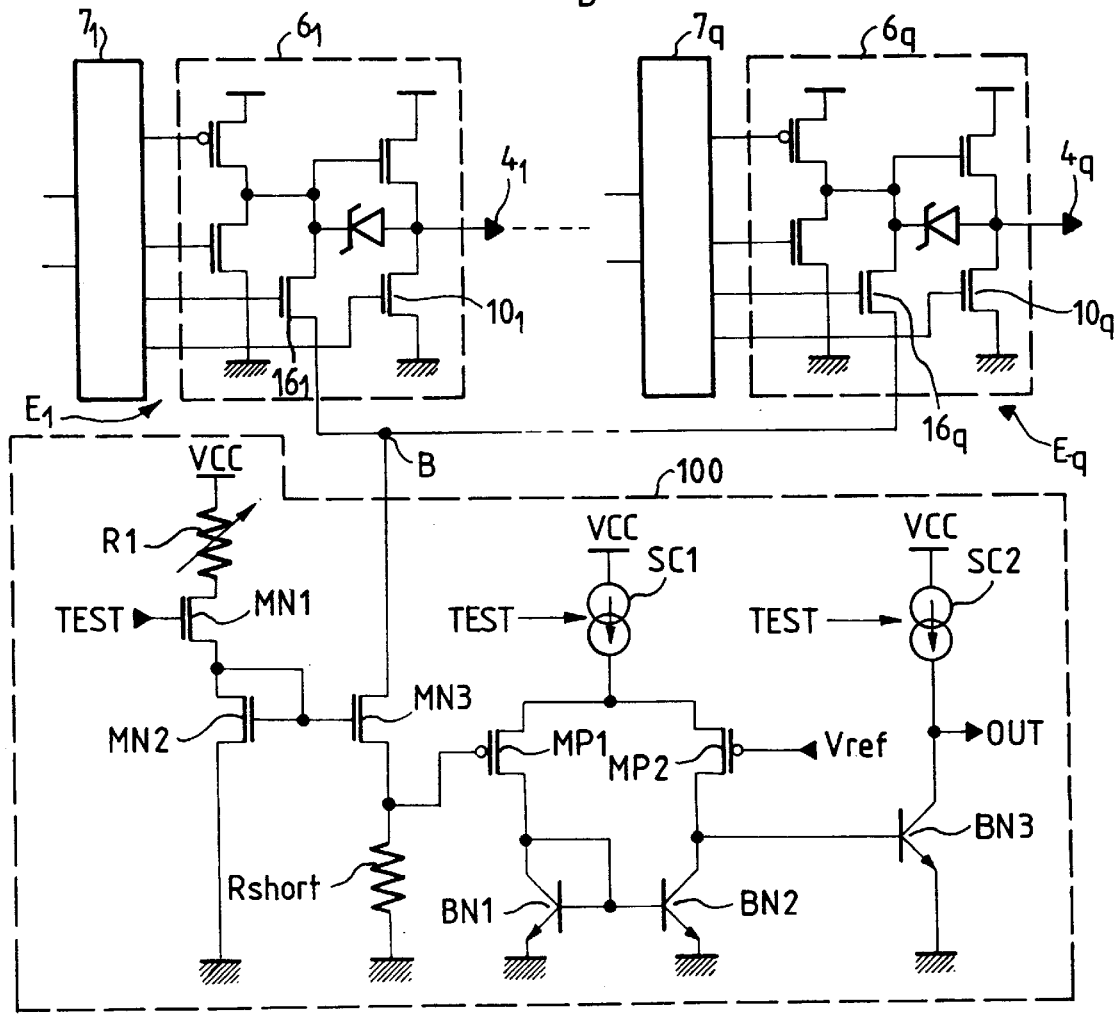
FIG_4

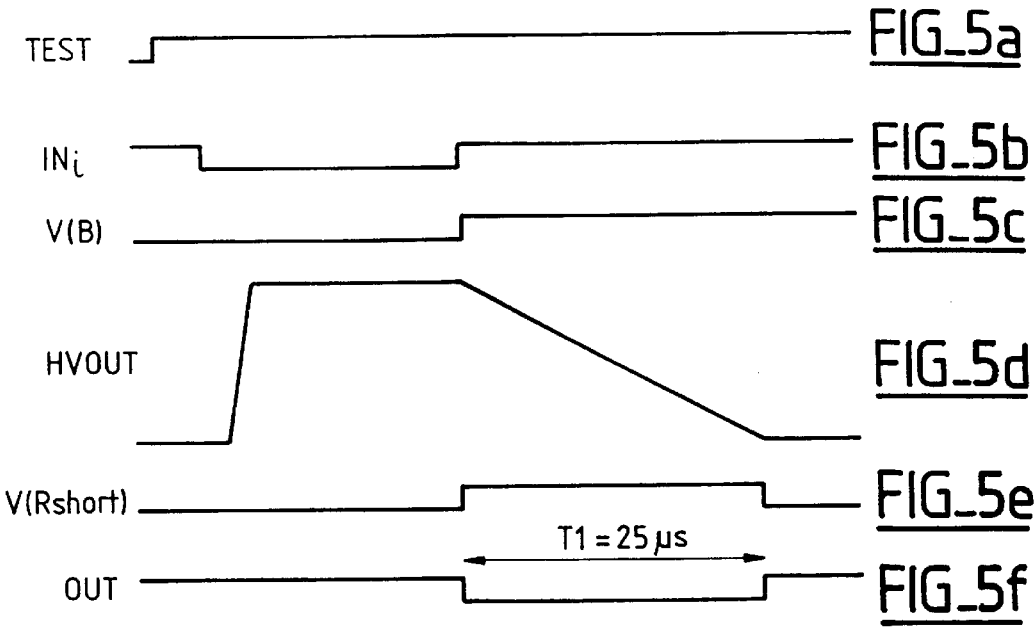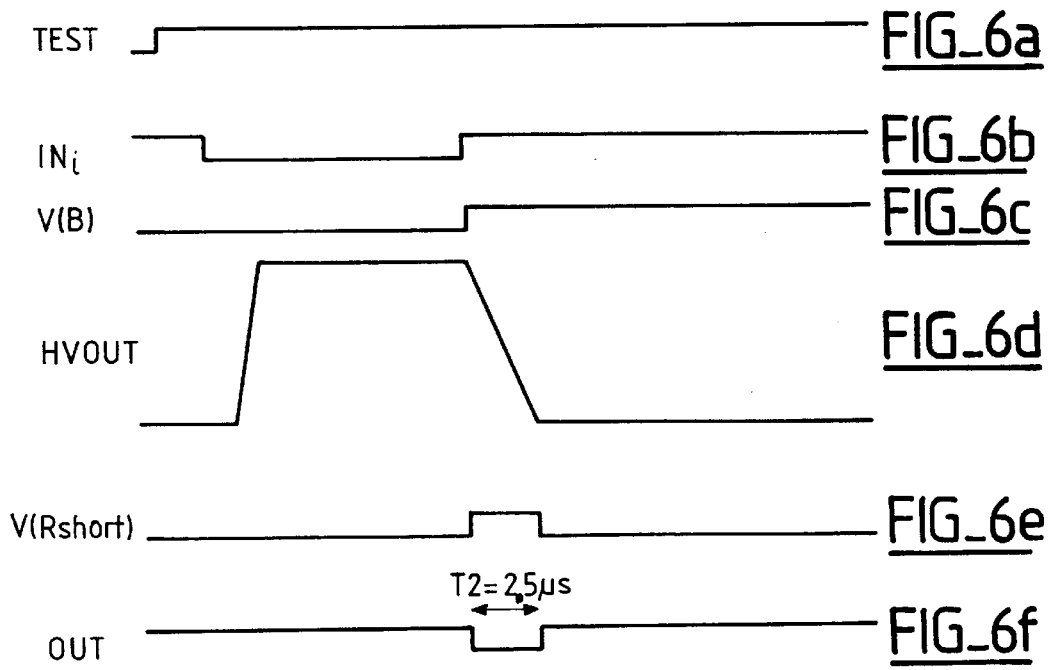

METHOD AND CIRCUIT FOR TESTING THE OUTPUT CONNECTIONS OF A DRIVER CIRCUIT FOR A PLASMA DISPLAY PANEL

CROSS-REFERENCE TO RELATED APPLICATIONS

This application is based upon and claims priority from prior French Patent Application No. 98-12101, filed Sep. 28, 1998, the entire disclosure of which is herein incorporated by reference.

BACKGROUND OF THE INVENTION

1. Field of the Invention

The present invention relates to plasma display panels, and more specifically to the testing of the output connections of a driver circuit for a plasma display panel.

2. Description of Related Art

A plasma display panel (PDP) is a matrix-type display having a matrix of cells arranged in rows (or lines) and columns. Each cell has a cavity filled with a rare gas, two drive electrodes, and deposit of red, green, or blue phosphor. A given cell of the display is lit by applying a high voltage between its drive electrodes. The high voltage causes the gas in the cavity to ionize and emit ultraviolet light, and the light excites the deposited phosphor to cause it to generate a luminous point of red, green, or blue light.

As shown in FIG. 1, each cell is connected at the intersection of a line and a column. More specifically, each cell Pij is connected by a first drive electrode to a conductor line Li that is common to all of the cells of the line bearing the sub-index i (where i is an integer between 1 and n) and by a second drive electrode to a conductor line Cj that is common to all of the cells of the column bearing the sub-index j (where j is an integer between 1 and m). Each of the conductor lines is externally connected a line electrode or a column electrode. To give an idea of size, a 50-inch screen in a 16/9 format typically has around 1000 line electrodes and 3000 column electrodes (i.e., n=1000 and m=3000). The line and column electrodes are also known as horizontal and vertical electrodes, respectively.

The driver circuits produce the high voltage drive signals that are required to set the cells of the panel to the lit or unlit state. A drive signal typically has a zero or negative potential (i.e., ground potential) in the low logic state, and a potential (with respect to ground) of around 100 to 150 volts in the high logic state. The logic states of the signals applied to the PDP line and column electrodes determine the cells that are driven to be lit and those that are driven to be unlit. At their input, the driver circuits receive low voltage control signals that typically have a zero potential in the low logic state and a potential (with respect to ground) of 5 volts in the high logic state.

As seen from the driver outputs, the plasma display panel electrodes can be regarded as a capacitor that must charged or discharged during an addressing sequence (i.e., when the high voltage drive signals change state) and a current source or sink whose current must be absorbed or supplied by the driver circuit during a sustain sequence (i.e., to maintain the lit or unlit states of the cells). Thus, the driver outputs for the PDP are designed to supply or absorb a current on the order of several tens of milliamps.

During operation, the lines are addressed sequentially (i.e., line by line). In particular, the line electrodes are selected one after the other by applying appropriate high voltage signals, and high voltage drive signals are also simultaneously applied to the column electrodes by the driver outputs. The potential differences generated between the drive electrodes of the cells determine their state (i.e., lit or unlit). This type of sequential addressing of the PDP electrode lines is possible by the virtue of the memory effect linked to the nature of the gas in the cell cavities.

FIG. 2 shows a plasma display panel 1 and the housing 3 of a driver module. The housing contains one or more printed circuits on which the one or more driver circuits (generally in integrated circuit form) are mounted. For example, an integrated circuit can contain 96 driver output stages. The outputs from the driver circuits are the outputs from those driver stages, and thus they can address 96 electrodes of the PDP. In other words, the output from each driver stage of the module drives a PDP column electrode. The 96 outputs from the integrated circuit are connected to their column electrodes through adapted connecting means (e.g., via conductive tracks etched on the printed circuit).

The plasma display panel 1 includes a glass plate 11 mounted on a substrate 12. The inner face of the plate 11 carries the phosphors (not shown), and the line electrodes and the column electrodes protrude from the glass plate 11 on the substrate 12. The electrical insulation between these different elements is provided by layers of dielectric material (not shown) and the inter-electrode pitch is very small (e.g., it can reach 100 microns). The driver module includes a housing 3, a low voltage control signal input connector (not shown), and the connecting means described above. The connecting means is typically a flat, flexible cable 5 having a set of parallel, mutually insulated conductors at a pitch equal to that of the column electrodes (i.e., 100 microns). In general, the flat cable 5 is a flexible printed circuit on which tracks are etched (a conductive track ribbon), and is stuck or pressed on the edge of the substrate 12 over the column electrodes Y.

During manufacturing, assembling the tracks of the flat cable 5 with the column electrodes Y is very critical. In particular, two types of faults can appear after the assembling operation: a bad contact between one track of the flat cable and at least one column electrode, which causes the cells of the corresponding column to not be driven; and a misalignment between the tracks of the flat cable and the column electrodes, which makes a track cause a short circuit between two adjacent column electrodes. According to manufacturers, the proportion of faults arising from non-connected or open circuit electrodes is 70% versus 30% of faults arising from a short circuit between two column electrodes.

The only conventional technique for testing the assembling of the connecting means involves powering up the plasma display panel and having it display a predetermined image. This allows a check of whether the displayed image corresponds to the expected image. A non-connected line and non-connected column electrode are respectively indicated on the screen by a horizontal or vertical line that remains dark. While this technique is reliable, it can only be implemented after the panel has been completely assembled. In particular, all of the panel's electronic circuits must be fitted, including those for generating the low voltage control signals and for the power supply. Thus, if there is a misalignment between the connecting means and the panel, it may be necessary to take the panel apart to correct the assembling fault.

SUMMARY OF THE INVENTION

In view of these drawbacks, it is an object of the present invention to overcome the above-mentioned drawbacks and to provide a method for testing the connection of outputs of at least one driver circuit that drives a plasma display panel formed of cells arranged in a matrix of lines and columns. The outputs of the driver circuit are connected to line and/or column electrodes of the plasma display panel. According to the method, an output of the driver circuit is switched to a high state for a predetermined time period and then switched to a low level. The time to discharge that output with a constant discharge current is measured, and the presence or absence of a capacitive load connected to that output is detected as a function of the measured time period. These steps are preferably repeated for each driver output stage of the driver circuit.

When an electrode is connected to the output stage of the driver circuit, the discharge time will have a first value. On the other hand, when the output is an open circuit as a result of a faulty connection with the corresponding electrode, the discharge time will have a second value that is shorter than the first value. (Nevertheless, in the latter case there occurs a discharge of the output that arises from the stray capacitance of the driver circuit terminal and the stray capacitance due to neighboring conductive tracks on the flat cable that are normally connected to other electrodes, so the second time period is not zero.) The method distinguishes between these two cases based on the measured discharge time.

One embodiment of the present invention provides a method for testing output connections of at least one driver circuit that drives a plasma display panel. According to the method, at least one output of the driver circuit is switched to a high level for a predetermined time period. The output of the driver circuit is switched to a low level, and the time to discharge the output of the driver circuit with a constant discharge current is measured. It is determined whether a capacitive load is connected to the output of the driver circuit based on the measured time to discharge. In one preferred method, these steps are repeated for each of the outputs of the driver circuit.

Another embodiment of the present invention provides a driver circuit for driving a plasma display panel. The driver circuit includes driver output stages whose outputs are driver outputs of the driver circuit, and means for selectively sinking a constant discharge current from the output of at least one of the driver output stages to ground. Additionally, the driver circuit includes means for producing a measuring logic pulse whose duration is a function of a time required to discharge the output, and means for determining whether a capacitive load is connected to the output based on the measuring logic pulse. In a preferred embodiment, the driver circuit also includes means for adjusting the discharge current to take into account characteristics of the plasma display panel that is connected to the driver circuit.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIG. 1 shows a matrix of cells in a plasma display panel;

FIG. 2 shows a plasma display panel connected to a driver module;

FIG. 3 is a circuit diagram showing a driver output stage of a driver circuit according to a preferred embodiment of the present invention;

FIG. 4 is a simplified circuit diagram showing a driver circuit according to an embodiment of the present invention;

FIGS. 5a through 5f are timing diagrams showing signals delivered to or received by the driver circuit in the case of a correct connection of the output under test; and FIGS. 6a through 6f are timing diagrams showing signals delivered to or received by the driver circuit in the case of a misconnection of the output under test.

DETAILED DESCRIPTION OF PREFERRED EMBODIMENTS

Preferred embodiments of the present invention will be described in detail hereinbelow with reference to the attached drawings.

FIG. 3 shows a driver output stage of a driver circuit according to a preferred embodiment of the present invention. The driver circuit has q outputs (e.g., 64 or 96), and is in the form of an integrated circuit. The circuit has q driver output stages whose outputs constitute the circuit outputs. Each of the driver output stages includes two inputs, two outputs, an output circuit, and a control circuit. The first input 2 receives a control signal IN that is a low voltage logic signal, and the second input 13 receives a signal TEST that is a low voltage logic signal that switches to the high state in the test mode. A main output 4 delivers a drive signal HVOUT that is a high voltage signal, and a test output node B is also provided.

The output circuit 6 includes a charging transistor 8 and a discharging transistor 10, and the control circuit 7 generates signals that control transistors 8 and 10 as a function of the low voltage control voltage IN. The output 4 of the driver output stage is designed for connection to a column electrode of a plasma display panel so that the drive signal HVOUT can set a cell to the lit or unlit state. As explained above, from a static point of view a cell can be regarded between its two drive electrodes as an equivalent capacitor of relatively high value (on the order of ten picofarads). This capacitor must be charged to set the cell to the lit state and discharged to set the cell to the unlit state.

Given the high voltage that must be reached to set the cell to the lit state and the considerable size of the capacitive load, the driver circuit must supply a load current and absorb a discharge current that are both of relatively high values (e.g., several tens of milliamps). The purpose of the driver output circuit 6 is to supply and absorb such currents. The charging transistor 8 and the discharging transistor 10 are MOS power transistors (e.g., of the N type). More specifically, the transistors are preferably of the VDMOS type, which can withstand high drain-source voltages and supply or absorb large currents.

The drain of charging transistor 8 is connected to a supply terminal that delivers the high voltage supply VPP (e.g., on the order of one hundred volts) and the source of the transistor is connected to the output 4. Additionally, the drain of discharging transistor 10 is connected to the output 4, and the source is connected to ground GND. The gate electrode of transistor 10 receives a control signal from the control circuit 7. In the embodiment of FIG. 3, transistor 8 operates as a compound P-type MOS transistor through the action of the other circuit elements. The output circuit has a P-type MOS transistor 42 whose source is connected to the supply terminal that delivers the high supply voltage VPP and whose drain is connected to a node A.

An N-type MOS transistor 44 has its drain connected to node A and its source connected to ground GND. The gate electrode of the charging transistor 8 is also connected to node A. The gate electrodes of transistors 42 and 44 receive control signals from the control circuit 7 to indirectly control the on or off state of transistor 8. A Zener diode Z1 is connected by its anode to the source of transistor 8 and by its cathode to node A to protect the gate oxide of transistor 8 from over-voltages. For more information on the operation of such a compound P-type MOS transistor, reference can be made to French patent application No. 97-06498 of the present assignee.

During operation, the charging transistor 8 is turned on and the discharging transistor 10 is turned off to charge the capacitive load and set the cell to the lit state. Conversely, the discharging transistor 10 is turned on and the charging transistor 8 is turned off to discharge the capacitive load and set the cell to the unlit state. The output circuit 6 also includes an N-type MOS transistor 16 whose drain is connected to node A and whose source is connected to the test output node B. The control gate of the transistor 16 receives a signal to set the transistor to the on state at certain times in the TEST mode. This transistor 16 functions as the TEST mode discharging transistor.

In further embodiments, transistors 8, 42, and 44 are replaced by a P-type MOS transistor, such as a PMOS transistor on thick oxide. In such embodiments, the Zener diode Z1 is removed and the drain of transistor 16 is connected directly to the output 4. Further, transistor 8 has its source connected to the supply terminal and its drain connected to the output 4, and the gate electrode of transistor 8 receives a control signal directly from the control circuit 7. However, such a transistor occupies much more chip area than the compound P-type transistor of the preferred embodiment.

The control circuit 7 also includes means for preventing the charging and discharging transistors from being simultaneously in the on state during transitions. This avoids short circuiting between the high voltage source VPP and ground GND. The exact design of the control circuit 7 can be chosen by one of ordinary skill in the art, and reference can be made to the patent application mentioned above for further details. Accordingly, this circuitry shall not be described in detail in the present description.

FIG. 4 shows a driver circuit in accordance with an embodiment of the present invention. As explained above, the driver circuit has q driver output stages like the one shown in FIG. 3. For simplicity, only the first stage El and the last stage Eq are shown in FIG. 4, and the elements common to FIG. 3 bear the same reference numerals. The test output nodes B of the q driver output stages are connected together. In other words, node B is common to all of the driver output stages of the driver circuit. Node B is connected to the outputs $4_1$ through $4_q$ of each stage via the Zener diode and the test mode discharging transistor (FIG. 3). Thus, the Zener diode of each stage serves as a link between the output of the stage and the test output node B.

The driver circuit also includes a test stage 100 having a resistor R1 connected between a power supply terminal that receives a low supply voltage VCC (e.g., 5 volts) and the drain of an N-type MOS transistor MN1. The source of the transistor MN1 is connected to the drain of an N-type transistor MN2, which is connected as a diode. (A diode connection for a MOS transistor involves connecting the drain and gate together.) The source of transistor MN2 is connected to ground and the control gate of transistor MN1 receives the signal TEST. Additionally, the test stage 100 includes an N-type MOS transistor MN3 whose drain is connected to the common node B and whose source is connected to ground via another resistor Rshort. The gate of transistor MN3 is connected to the gate of transistor MN2 so that these two transistors operate as a current mirror.

These elements of the driver circuit serve to sink a constant discharge current from the common node B to ground. The discharge current passes through the resistor Rshort so a voltage drop is produced across the terminals of the resistor. The value of the discharge current is essentially determined by the value of R1 for a set value for VCC, and this value can be adjusted to take into account the capacitive load connected to the outputs $4_1$ through $4_q$ of the driver output stages. Thus, the value of the discharge current can be adjusted to take the characteristics of the PDP into account.

The test stage 100 also includes a pair of P-type MOS transistors MP1 and MP2 that form a differential amplifier. The sources of transistors MP1 and MP2 are connected together at the negative terminal of a current source SC1 whose positive terminal is connected to a terminal that receives the low power supply voltage VCC. The drain of transistor MP1 is connected to the collector of an NPN bipolar transistor BN1 that is connected as a diode. (A diode connection for a bipolar transistor involves connecting together the collector and base.) Additionally, the drain of transistor MP2 is connected to the collector of another NPN bipolar transistor BN2.

The emitters of transistors BN1 and BN2 are connected to ground and their bases are connected together so that these transistors operate as a current mirror. Thus, the current flow is the same in each branch of the differential amplifier. The gate of transistor MP1 is connected to the source of transistor MN3 to receive the voltage V(Rshort) at the non-grounded terminal of resistor Rshort. The gate of transistor MP2 receives a reference voltage Vref, so the voltage at the collector of transistor BN2 is proportional to the difference between the voltages V(Rshort) and Vref.

The collector of transistor BN2 forms the output of the differential amplifier and is connected to the base of an NPN bipolar transistor BN3. The collector of transistor BN3 is connected to the negative terminal of a current source SC2 whose positive terminal is connected to a terminal that receives the low power supply voltage VCC. The emitter of transistor BN3 is connected to ground. The collector of transistor BN3 constitutes the output of a signal shaping stage formed by SC2 and transistor BN3 and also the output of the test stage 100 that delivers a low voltage logic signal OUT. Transistor BN3 operates as an inverter comparator. The function of the signal shaping stage is to set the logic signal OUT to the high or low state depending on the voltage level at the output of the differential amplifier. In this embodiment, the test stage 100 is advantageously formed just once in each driver output circuit and the q outputs of the driver are tested in succession.

The operation of the driver circuit in the test mode will now be described. The connections of the q outputs of the driver are tested in an iterative fashion. The timing diagrams of FIGS. 5a to 5f illustrate the case of an output that is correctly connected to an electrode of the plasma display panel, and the timing diagrams of FIGS. 6a to 6f illustrate the case of an output that is not connected to an electrode of the plasma display panel. The test mode is activated by the transition of the signal TEST to a high logic level (FIGS. 5a and 6a). When the signal TEST is activated, the logic signal that controls the discharging transistor 10 keeps it constantly in the off state. Thus, the discharging of the outputs can only be effected through transistor 16. When the test mode is deactivated, transistor 16 is kept constantly in the off state.

Thus, in normal operation, the outputs are discharged by the discharging transistor 10.

During testing, the driver output stages are controlled so that each output is successively switched to the high logic state. The output remains in the high state for a predetermined period that corresponds to at least the duration of the addressing phase during which the panel electrode connected to the output under test is being charged (assuming that this connection is correctly made). This begins at the transition to the low logic state of the control signal INi that is inputted to the driver output stage Ei corresponding to that output (where i is an index between 1 and q) in FIGS. 5b and 6b. Preferably, the other outputs of the driver circuit are kept in the low state during this first period. This configuration yields a maximum value for the capacitive load at the output under test (e.g., on the order of 50 pF).

Next, the driver output stages are controlled such that the output switches to the low state. This starts with the signal INi returning to the high state, as shown in FIGS. 5b and 6b. The capacitive charge on a panel electrode that is correctly connected to the output under test then begins to discharge. The control signal sent to the discharging transistor 10i by the control circuit 7i of stage Ei is held at the low state. Conversely, the control signal sent by the control circuit 7i to the test mode discharging transistor 16i is at the high state. Accordingly, the output is discharged not through transistor 10i, but through transistor 16i.

Thus, the discharge current passes through the Zener diode and the test mode discharging transistor of the driver output stage Ei and from the common node B through transistor MN3 and the resistor Rshort of the test stage 100. This current is constant and has a value that is set by resistor R1 as explained above. FIGS. 5c and 6c show the form of the voltage V(B) at the common node B. This voltage is zero during the first step and substantially equal to the voltage drop at the terminals of Rshort when a given output under test is being discharged. Even if the output under test is not connected to an electrode, it still produces a discharge of the stray capacitance associated with the output under test. (These capacitances as a whole typically have a value of 5 pF.)

Preferably, resistor R1 has a value such that the discharge current is low (e.g., on the order of one hundred microamps) so that the discharge time of the output is correspondingly longer. The time taken to discharge the output is measured in the following way. First, the constant discharge current is converted into a constant voltage corresponding to the voltage drop at the terminals of Rshort. Then, the differential amplifier and the signal shaping stage of test stage 100 produce a measuring logic pulse whose length is a function of the discharge time. The presence or absence of a capacitive load is detected as a function of the time that is measured (i.e., in terms of the length of the measuring logic pulse).

This pulse is processed using an appropriate method. For example, in a first processing method, the measuring logic pulse is processed by a time filtering circuit that only outputs pulses having a length that exceeds a threshold. For example, such a circuit can be formed by an AND-type logic gate that receives the measuring logic pulse and a delayed form of the pulse. The amount of delay corresponds to the threshold. This method is very simple to implement. In another processing method, the measuring logic pulse is compared with a corresponding reference pulse that is obtained simultaneously from a reference output of the driver circuit, in conjunction with an associated comparator circuit like circuit 100.

In one such embodiment, the reference output is an open circuit (i.e., it is not connected to a panel electrode) so it effectively forms an extra output that is not used to drive the plasma display panel. The discharge time of this output establishes the discharge time of an incorrectly connected electrode. Any discharge time period far exceeding this reference time period is deemed to result from a correctly connected electrode, within the error due to the stray capacitance arising from the length of the flexible connector. In another embodiment, the reference output is connected to a panel electrode such as the first output of the driver circuit.

The prior embodiment has the advantage of eliminating the risk of detection errors arising from the spread in physical characteristics of the driver circuit, while the latter embodiment is even better because it eliminates the risk of errors linked to the spread in the characteristics of the panel. In the latter embodiment, care must be taken to ensure that the control signals sent to inputs of the drive output stages are such that the output under test and the reference output exhibit the same theoretical capacitive load. The capacitive load of an output depends on whether or not it is connected to its panel electrode and on the voltage state of the two neighboring electrodes. The discharge time of the reference electrode and the electrode under test must be equal because any difference implies a bad connection of one of the two electrodes.

FIGS. 5d through 5f show the shape of the high voltage drive signal HVOUT delivered by the output under test 4i, the voltage V(Rshort), and the signal OUT in the case in which the output under test is correctly connected to a panel electrode. On the other hand, FIGS. 6d through 6f show the same signals and voltages in the opposite case in which the output under test is an open circuit. In FIG. 5d, from the start of the second step, the high voltage drive signal HVOUT exhibits a first slope reflecting a discharge of the output under test with a constant current. This discharge lasts for a first time period that determines the length of the measuring pulse. The length T1 of the measuring pulse against the signal OUT is on the order of 25 $\mu$s (with a discharge current on the order of 50 $\mu$A, a load capacitance on the order of 50 pF, and a supply voltage of 25V).

In FIG. 6d, the high voltage drive signal HVOUT exhibits a second, relatively steeper, slope that reflects a faster discharge of the output under test under constant current. This discharge lasts for a second time period that is shorter than the first time period. The length T2 of the measuring pulse on the signal OUT is on the order of 2.5 $\mu$s (with a discharge current on the order of 50 $\mu$mA, a stray output capacitance on the order of 5 pF, and the same supply voltage of 25V). The greater T1 and T2 are with the same ratio, the easier they can be distinguished. Thus, it is advantageous to cause the output under test to discharge with a low current.

In the preferred embodiment, these steps are repeated for each output of the driver circuit. However, in further embodiments, the output connections of several or all the driver circuits of the drive module are tested. The test method for the outputs of the drive circuit described above can be successively performed for each drive circuit of the module, or the procedure can be simultaneously performed for each drive circuit of the module.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method for testing output connections of at least one driver circuit that drives a plasma display panel having cells arranged in a matrix of lines and columns, the outputs of the driver circuit being connected to line and/or column electrodes of the plasma display panel, said method comprising the steps of:
    switching at least one output of the driver circuit to a high level for a predetermined time period;
    switching the output of the driver circuit to a low level;
    measuring time to discharge the output of the driver circuit with a constant discharge current; and
    determining whether a capacitive load is connected to the output of the driver circuit based on the measured time to discharge.

2. The method as defined in claim 1, further comprising the step of repeating the previous steps for each of the outputs of the driver circuit.

3. The method as defined in claim 1, wherein in the step of switching at least one output of the driver circuit to the high level, all other outputs of the driver circuit are held at the low level.

4. The method as defined in claim 1, wherein the discharge current is on the order of one hundred microamps.

5. The method as defined in claim 1, wherein in the measuring step, the discharge current is converted into a voltage so as to produce a measuring logic pulse whose length is a function of the time to discharge.

6. The method as defined in claim 5, wherein the determining step includes the sub-step of time filtering the measuring logic pulse.

7. The method as defined in claim 5, wherein the determining step includes the sub-step of comparing the measuring logic pulse with a reference pulse that is simultaneously obtained based a reference output of the driver circuit.

8. The method as defined in claim 7, wherein the reference output is in open circuit.

9. The method as defined in claim 7, wherein the reference output is connected to an electrode of the plasma display panel.

10. A method for testing output connections of a plurality of driver circuits of a driver module that drives a plasma display panel having cells arranged in a matrix of lines and columns, the outputs of the driver circuits being connected to line and/or column electrodes of the plasma display panel, said method comprising the steps of:
    testing a first of the driver circuits through a process that includes:
        switching at least one output of the first driver circuit to a high level for a predetermined time period;
        switching the output of the first driver circuit to a low level;
        measuring time to discharge the output of the first driver circuit with a constant discharge current; and
        determining whether a capacitive load is connected to the output of the first driver circuit based on the measured time to discharge; and
    testing a second of the driver circuits through a process that includes:
        switching at least one output of the second driver circuit to a high level for a predetermined time period;
        switching the output of the second driver circuit to a low level;
        measuring time to discharge the output of the second driver circuit with a constant discharge current; and
        determining whether a capacitive load is connected to the output of the second driver circuit based on the measured time to discharge.

11. The method as defined in claim 10, wherein the steps of testing the first driver circuit and testing the second driver circuit are carried out successively.

12. The method as defined in claim 10, wherein the steps of testing the first driver circuit and testing the second driver circuit are carried out simultaneously.

13. A machine-readable medium encoded with a program for testing output connections of at least one driver circuit that drives a plasma display panel having cells arranged in a matrix of lines and columns, the outputs of the driver circuit being connected to line and/or column electrodes of the plasma display panel, said program containing instructions for performing the steps of:
    switching at least one output of the driver circuit to a high level for a predetermined time period;
    switching the output of the driver circuit to a low level;
    measuring time to discharge the output of the driver circuit with a constant discharge current; and
    determining whether a capacitive load is connected to the output of the driver circuit based on the measured time to discharge.

14. The machine-readable medium as defined in claim 13, wherein said program further contains instructions for performing the step of repeating the previous steps for each of the outputs of the driver circuit.

15. The machine-readable medium as defined in claim 13, wherein in the step of switching at least one output of the driver circuit to the high level, all other outputs of the driver circuit are held at the low level.

16. The machine-readable medium as defined in claim 13, wherein in the measuring step, the discharge current is converted into a voltage so as to produce a measuring logic pulse whose length is a function of the time to discharge.

17. The machine-readable medium as defined in claim 16, wherein the determining step includes the sub-step of time filtering the measuring logic pulse.

18. The machine-readable medium as defined in claim 16, wherein the determining step includes the sub-step of comparing the measuring logic pulse with a reference pulse that is simultaneously obtained based a reference output of the driver circuit.

19. A driver circuit for driving a plasma display panel having cells arranged in a matrix of lines and columns, the outputs of the driver circuit being connected to line and/or column electrodes of the plasma display panel, said driver circuit comprising:
    a plurality of driver output stages whose outputs are driver outputs of the driver circuit;
    means for selectively sinking a constant discharge current from the output of at least one of the driver output stages to ground;
    means for producing a measuring logic pulse whose duration is a function of a time required to discharge the output; and means for determining whether a capacitive load is connected to the output based on the measuring logic pulse.

20. The driver circuit as defined in claim 19, further comprising means for adjusting the discharge current to take into account characteristics of the plasma display panel that is connected to the driver circuit.

21. The driver circuit as defined in claim 19, wherein the discharge current is on the order of one hundred microamps.

22. The driver circuit as defined in claim 19, wherein the means for determining includes a time filtering circuit.

23. The driver circuit as defined in claim 19, wherein the means for determining includes a comparison circuit for comparing the measuring logic pulse with a reference pulse.

* * * * *